(12) United States Patent
Bode et al.

(10) Patent No.: US 6,410,351 B1
(45) Date of Patent: Jun. 25, 2002

(54) METHOD AND APPARATUS FOR MODELING THICKNESS PROFILES AND CONTROLLING SUBSEQUENT ETCH PROCESS

(75) Inventors: Christopher A. Bode; Anthony J. Toprac, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/615,481

(22) Filed: Jul. 13, 2000

(51) Int. Cl.$^7$ ................................. H01L 21/4763
(52) U.S. Cl. ...................... 438/14; 438/641; 156/345
(58) Field of Search ........................... 438/629, 220, 438/595, 710; 700/121; 156/345

(56) References Cited

U.S. PATENT DOCUMENTS

| | | | | |
|---|---|---|---|---|
| 6,133,132 A | * | 10/2000 | Toprac | 438/595 |
| 6,161,054 A | * | 12/2000 | Rosenthal | 700/121 |
| 6,298,470 B1 | * | 10/2001 | Breiner | 716/4 |

* cited by examiner

Primary Examiner—John F. Niebling
Assistant Examiner—Andre C Stevenson
(74) Attorney, Agent, or Firm—Williams, Morgan & Amerson, P.C.

(57) ABSTRACT

A processing line includes a deposition tool, a metrology tool, an etch tool, and a process controller. The deposition tool is adapted to form a process layer on a plurality of wafers. The metrology tool is adapted to measure the thickness of the process layer for a sample of the wafers. The etch tool is adapted to etch the process layer in accordance with an operating recipe. The process controller is adapted to store a thickness profile model of the deposition tool, generate predicted process layer thicknesses for the wafers not measured by the metrology tool based on the process layer thickness measurements of the wafers in the sample and the thickness profile model, and modify the operating recipe of the etch tool based on the predicted process layer thicknesses. A method for controlling wafer uniformity includes storing a thickness profile model of a deposition tool; depositing a process layer on a plurality of wafers in the deposition tool; measuring the thickness of the process layer for a sample of the wafers; generating predicted process layer thicknesses for the wafers not measured based on the process layer thickness measurements and the thickness profile model; and etching the process layer in an etching tool in accordance with an operating recipe, the operating recipe being based on the predicted process layer thicknesses.

18 Claims, 2 Drawing Sheets

METHOD AND APPARATUS FOR MODELING THICKNESS PROFILES AND CONTROLLING SUBSEQUENT ETCH PROCESS

BACKGROUND OF THE INVENTION

1. Field of the Invention

This invention relates generally to semiconductor device manufacturing, and, more particularly, to a method and apparatus for modeling the thickness profile of a deposition tool, such as a diffusion furnace, and controlling a subsequent etch process.

2. Description of the Related Art

In the manufacture of semiconductor devices, wafers, such as silicon wafers, are subjected to a number of processing steps. The processing steps include depositing or forming layers, patterning the layers, and removing portions of the layers to define features on the wafer. One such process used to form the layers is known as chemical vapor deposition (CVD), wherein reactive gases are introduced into a vessel, e.g., a CVD tool, containing the semiconductor wafers. The reactive gases facilitate a chemical reaction that causes a layer to form on the wafers. One exemplary deposition process is the formation of polysilicon by reacting nitrogen ($N_2$) and silane ($SiH_4$) in a furnace.

There are many factors that affect the deposition rate of a deposition tool. These factors include, among other things, the flow rate of reactive gases through the chamber and the temperature of the chamber. Typically, to determine the deposition rate for a particular tool (e.g, when it is first placed in service or after a maintenance event), a series of qualification wafers are processed and the resultant thickness of the process layer is measured. The measurements are used to estimate the deposition rate of the tool. Deposition times for subsequently processed wafers are determined based on the anticipated deposition rate. Normal variations in temperature and reactant flow rate may cause a deviation in the deposition rate from the anticipated rate, causing the process to exceed a control limit.

A typical deposition tool, such as a vertical furnace, processes a multiple lots of wafers simultaneously (e.g., 50 or more wafers). The wafers are placed in a carrier and inserted into the furnace. Typically, the reactive gases that are used to form the process layer are introduced into the bottom of the furnace. As the reactive gases circulate toward the top of the furnace, the A concentrations of the reactive gases decrease (i.e., the reactive gases are consumed in forming the process layers on the lower wafers). This decreased concentration results in a lower deposition rate as the distance from the gas inlet increases. To address this situation, the furnace is divided into zones (e.g., 4 zones) and the temperature of each zone is controlled independently. The zones nearer the top of the furnace are controlled at a higher temperature than those nearer the bottom to increase their localized deposition rates.

Although the approach described above tends to normalize the average deposition rate across the zones, is does not address thickness variations within a zone. Subsequent etch tools can be configured to etch the process layer based on the average deposition rate, but variations present in the wafers processed in a particular zone will propagate through the etch process, resulting in variations in the post-etch characteristics (i.e., the layers may be over-etched or underetched). Process variations can result in reduced equipment utilization and availability. Generally, a greater process variation results in a more costly and less efficient processing system.

The present invention is directed to overcoming, or at least reducing the effects of, one or more of the problems set forth above.

SUMMARY OF THE INVENTION

One aspect of the present invention is seen in a processing line including a deposition tool, a metrology tool, an etch tool, and a process controller. The deposition tool is adapted to form a process layer on a plurality of wafers. The metrology tool is adapted to measure the thickness of the process layer for a sample of the wafers. The etch tool is adapted to etch the process layer in accordance with an operating recipe. The process controller is adapted to store a thickness profile model of the deposition tool, generate predicted process layer thicknesses for the wafers not measured by the metrology tool based on the process layer thickness measurements of the wafers in the sample and the thickness profile model, and modify the operating recipe of the etch tool based on the predicted process layer thicknesses.

Another aspect of the present invention is seen in a method for controlling wafer uniformity. The method includes storing a thickness profile model of a deposition tool; depositing a process layer on a plurality of wafers in the deposition tool; measuring the thickness of the process layer for a sample of the wafers; generating predicted process layer thicknesses for the wafers not measured based on the process layer thickness measurements and the thickness profile model; and etching the process layer in an etching tool in accordance with an operating recipe, the operating recipe being based on the predicted process layer thicknesses.

BRIEF DESCRIPTION OF THE DRAWINGS

The invention may be understood by reference to the following description taken in conjunction with the accompanying drawings, in which like reference numerals identify like elements, and in which.

Figure 1:
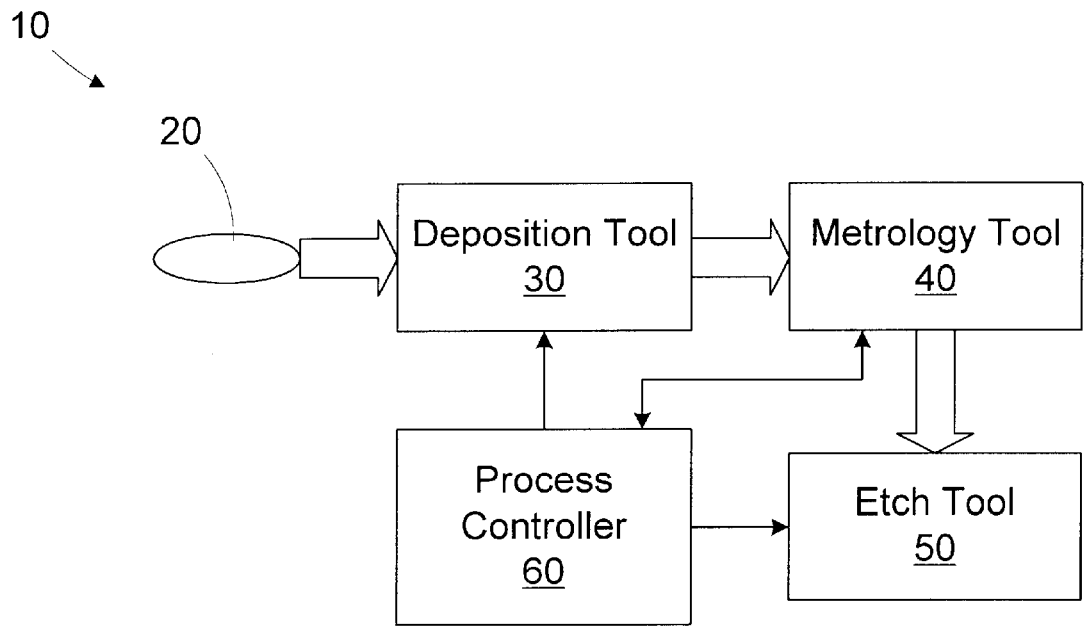
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring first to FIG. 1, a simplified diagram of an illustrative processing line 10 for processing wafers 20 in accordance with the present invention is provided. The processing line includes a deposition tool 30, a metrology tool 40, an etch tool 50, and a process controller 60. The process controller 60 interfaces with the deposition tool 30, metrology tool 40, and etch tool 50 for modeling the thickness profile of the deposition tool 30 and modifying operating parameters of the etch tool 50 to account for wafer-to-wafer variation in the thickness of the process layer formed by the deposition tool 30. The model of the deposition tool 30 predicts process layer thicknesses for individual wafers processed in the deposition tool 30. The metrology tool 40 may be used to provide an input to the process controller 60 for applying the thickness profile model and also to provide feedback for updating the model.

In the illustrated embodiment, the deposition tool 30 is a CVD chamber useful for depositing a polysilicon layer on the semiconductor wafers 20. Reactive gases, including nitrogen ($N_2$) and silane ($SiH_4$), are provided to the deposition tool 30 to facilitate the polysilicon formation. A suitable deposition tool 30 is a TEL vertical furnace. Although the invention is described in the context of being implemented in a polysilicon deposition furnace, the concepts described herein may be applied to various other deposition tools used for forming a variety of process layers, such as silicon dioxide, silicon nitride, silicon oxynitride, oxygenated polysilicon, titanium nitride, and doped silicon glasses such as boron-phosphorous-silicon-glass (BPSG), or other process layers used in semiconductor manufacturing operations.

The process controller 60 contains a model of the thickness profile for the deposition tool 30. The thickness profile model may be generated and/or updated based on input from the metrology tool 40 of the actual thickness of the deposited layer. An exemplary metrology tool 40 suitable for measuring the thickness of the layer is an Optiprobe tool offered by Thermawave.

In the illustrated embodiment, the process controller 60 is a computer programmed with software to implement the functions described. However, as will be appreciated by those of ordinary skill in the art, a hardware controller designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 60 described is the Catalyst system offered by KLA-Tencor Corporation. The KLA-Tencor Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The process controller 60 uses the measurements from the metrology tool 40 as inputs to the thickness profile model for the deposition tool 30. The metrology tool 40 measures the thickness of the process layer formed by the deposition tool 30 for a sample of wafers in each zone of the deposition tool 30. Other deposition process variables, such as the deposition time and control temperature of each zone, may also be provided as direct inputs to the thickness profile model. The thickness profile model predicts thicknesses of individual wafers processed in the deposition tool 30. Each wafer 20 has a unique wafer identification number (i.e., wafer-ID). The process controller 60 stores the predicted process layer thickness for each wafer with its associated wafer-ID. The data storage functions may be implemented within the process controller 60 or on an independent database server (not shown). The process controller 60 may generate a process layer thickness prediction for each individual wafer 20, or alternatively, the wafers 20 may be grouped into small subsets (e.g., three wafers), and one process layer thickness prediction may be assigned to each wafer 20 in the subset.

The process controller 60 uses the process layer thickness predictions to adjust or determine the operating recipe of the etch tool 50 for each of the wafers. The wafer-ID of the wafer being processed is used to access the predicted process layer thickness for that wafer, and the recipe is modified accordingly. Typically, the process controller 60 modifies the etch time parameter of the etch tool 40 based on the predicted process layer thickness.

The thickness profile model may be generated by the process controller 60, or alternatively, the model may be generated by a different processing resource (not shown) and stored on the process controller 60 after being developed. The thickness profile model may be developed using the deposition tool 30 or on a different tool (not shown) having similar operating characteristics. For purposes of illustration, it is assumed that the thickness profile model is generated and updated by the process controller 60 based on actual performance of the deposition tool 30 as measured by the metrology tool 40. The thickness profile model is trained based on historical data collected from numerous processing runs of the deposition tool 30. A large number of samples are taken from wafers processed in various points in the deposition tool 30. The number of sample locations and points is much higher during the training period than during a production run. During production, only a limited number of samples need be taken and fed to the thickness profile model. Various modeling techniques, well known to those of ordinary skill in the art, are suitable. Exemplary modeling techniques include neural network modeling, principal component analysis (PCA), projection to latent structures (PLS), statistical response surface models (RSM), and first-principle physics and chemistry-based models.

The following example is provided as a high-level illustration of how a model of the deposition tool 30 may be generated. The specific implementation of the model may vary depending on the modeling technique selected, and such specific implementation is well known to those of ordinary skill in the art. Thus, for clarity and ease of illustration, such specific details are not described in greater detail herein.

Figure 2:
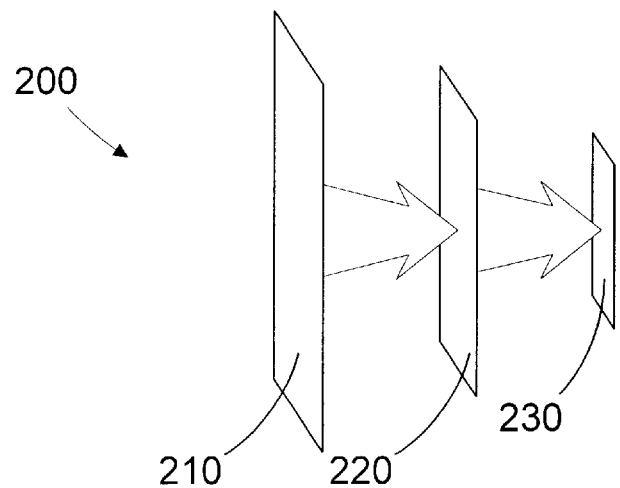
FIG. 2 is a simplified diagram of a neural network modeling system in accordance with one embodiment of the present invention.

Turning briefly to FIG. 2, a simplified diagram of a neural network 200 is provided. The neural network 200 includes an input layer 210, a hidden layer 220, and an output layer 230. The input layer 210 receives those input values deemed appropriate for modeling the performance of the deposition tool 30. In the illustrated embodiment, variables such as the sampled process layer thicknesses, deposition time, and zone operating temperature are received as inputs, although other inputs may also be used. The hidden layer 220 "learns" the interactions between the various inputs through a training procedure by which the neural network 200 is exposed to historical performance data of the deposition tool 30 or a similar deposition tool (not shown). The hidden layer 220 weights each of the inputs and/or combinations of the inputs to predict some future performance. Through analysis of historical data, the weighting values are changed to try to increase the success at which the model predicts the future performance. The output layer 230 distills the manipulation of the hidden layer 220 to generate a prediction of the process layer thicknesses for each wafer or subset of wafers.

Once the model is sufficiently trained, it may be used in a production environment to predict the thickness profile of the deposition tool 30 based on current input value measurements. Based on the results predicted by the neural network 200, the operating recipe of the etch tool 40 is modified. In the production environment, periodic measurements from the metrology tool 40 are provided as inputs to the thickness profile model and as feedback to the process controller 60 for updating the deposition process model.

Figure 3:
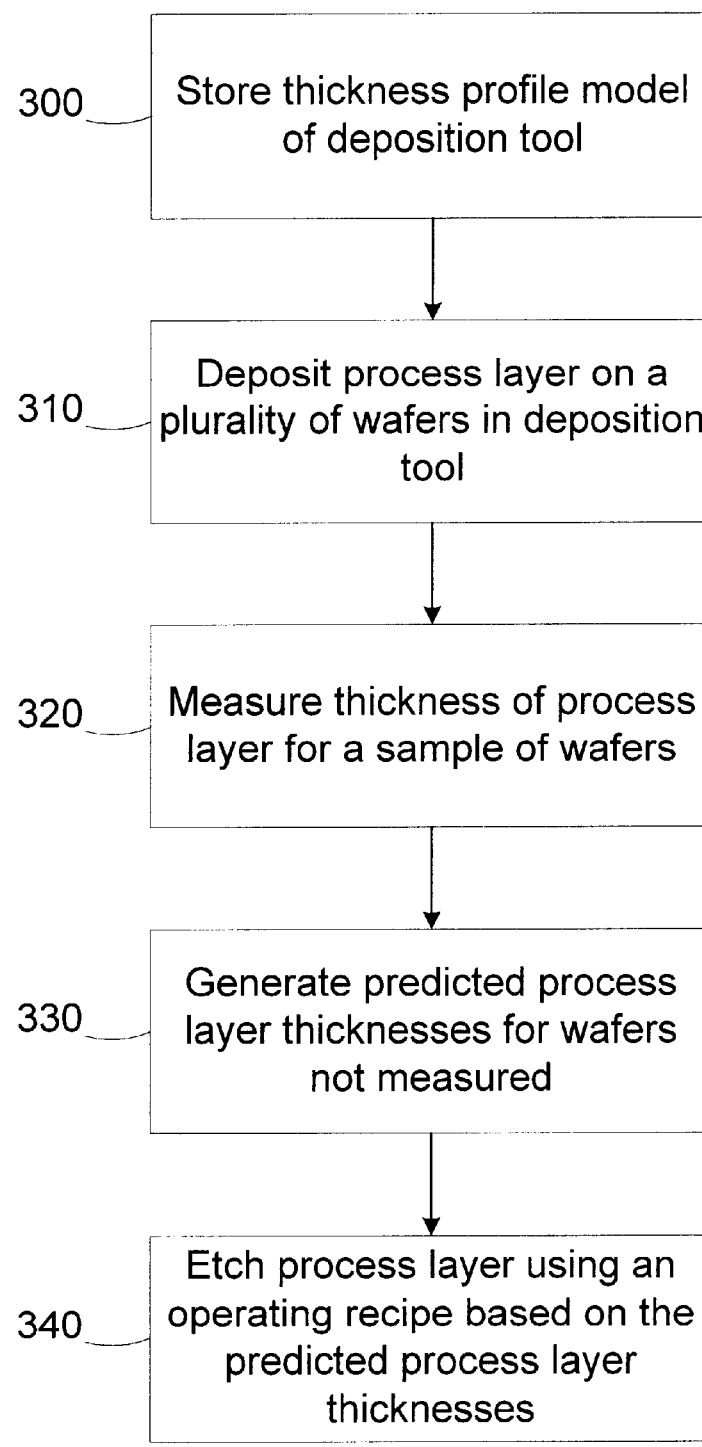
FIG. 3 is a flow diagram of a method for controlling wafer uniformity in accordance with one aspect of the present invention.

Referring now to FIG. 3, a flow diagram of a method for controlling wafer uniformity in accordance with one aspect of the present invention is provided. In block 300, a thickness profile model of a deposition tool is stored. In block 310, a process layer is deposited on a plurality of wafers in the deposition tool. In block 320, the thickness of the process layer is measured for a sample of the wafers. In block 330, predicted process layer thicknesses are generated for the wafers not measured based on the process layer thickness measurements and the thickness profile model. In block 340, the process layer is etched in an etching tool in accordance with an operating recipe. The operating recipe is based on the predicted process layer thicknesses.

Modeling the thickness profile of the deposition tool 30 and adjusting the operating recipe of the etch tool 40 accordingly reduces the amount of post-etch process layer thickness deviation in the wafers 20. This increases the efficiency of the processing line 10 by increasing yield. Also, a lower process variation during the fabrication process generally results in a finished product having narrower performance variations, thus enhancing profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling wafer uniformity, comprising:
   storing a thickness profile model of a deposition tool;
   concurrently depositing a process layer on a plurality of wafers in the deposition tool;
   measuring the thickness of the process layer for a sample of the wafers;
   generating predicted process layer thicknesses for the wafers not measured based on the process layer thickness measurements and the thickness profile model; and
   etching the process layer in an etching tool in accordance with an operating recipe, the operating recipe being based on the predicted process layer thicknesses.

2. The method of claim 1, wherein the deposition tool includes a plurality of control zones, and measuring the thickness of the process layer for the sample of wafers includes measuring the thickness of the process layer for at least one wafer from each of the control zones.

3. The method of claim 1, wherein generating predicted process layer thicknesses includes generating the predicted process layer thicknesses based on an operating recipe of the deposition tool.

4. The method of claim 1, wherein generating the predicted process layer thicknesses includes generating the predicted process layer thicknesses based on at least one of a deposition time and a temperature parameter in the operating recipe of the deposition tool.

5. The method of claim 1, wherein the deposition tool includes a plurality of control zones and generating the predicted process layer thicknesses includes generating the predicted process layer thicknesses based on a temperature parameter associated with each of the zones in the operating recipe of the deposition tool.

6. The method of claim 1, further comprising modifying the operating recipe of the etch tool based on the predicted process layer thicknesses.

7. The method of claim 6, wherein modifying the operating recipe includes modifying an etch time parameter in the operating recipe of the etch tool based on the predicted process layer thicknesses.

8. The method of claim 7, wherein modifying the operating recipe of the etch tool based on the predicted process layer thicknesses includes:
   associating the predicted process layer thicknesses with wafer identification numbers of the wafers;
   determining the wafer identification number of a particular wafer being etched;
   accessing the predicted process layer thickness of the particular wafer; and
   modifying the operating recipe of the etch tool for the particular wafer.

9. The method of claim 8, wherein associating the predicted process layer thicknesses with wafer identification numbers of the wafers includes associating a particular predicted process layer thickness with a subset of the wafers.

10. A processing line, comprising:
- a deposition tool adapted to concurrently form a process layer on a plurality of wafers;
- a metrology tool adapted to measure the thickness of the process layer for a sample of the wafers;
- an etch tool adapted to etch the process layer in accordance with an operating recipe; and
- a process controller adapted to store a thickness profile model of the deposition tool, generate predicted process layer thicknesses for the wafers not measured by the metrology tool based on the process layer thickness measurements of the wafers in the sample and the thickness profile model, and modify the operating recipe of the etch tool based on the predicted process layer thicknesses.

11. The processing line of claim 10, wherein the deposition tool includes a plurality of control zones, and the sample of wafers measured by the metrology tool includes at least one wafer from each of the control zones.

12. The processing line of claim 10, wherein the process controller is adapted to generate the predicted process layer thicknesses based on an operating recipe of the deposition tool.

13. The processing line of claim 10, wherein the operating recipe of the deposition tool includes at least one of a deposition time and a temperature parameter in the operating recipe.

14. The processing line of claim 10, wherein the deposition tool includes a plurality of control zones, and the process controller is adapted to generate the predicted process layer thicknesses based on a temperature parameter associated with each of the zones in the operating recipe.

15. The processing line of claim 10, wherein the process controller is adapted to modify an etch time parameter in the operating recipe of the etch tool based on the predicted process layer thicknesses.

16. The processing line of claim 10, wherein the process controller is adapted to associate the predicted process layer thicknesses with wafer identification numbers of the wafers, determine the wafer identification number of a particular wafer being etched, access the predicted process layer thickness of the particular wafer, and modifying the operating recipe of the etch tool for the particular wafer.

17. The processing line of claim 10, wherein the process controller is adapted to associate a particular predicted process layer thickness with a subset of the wafers.

18. A processing line, comprising:
- a deposition tool adapted to concurrently form a process layer on a plurality of wafers;
- means for storing a thickness profile model of the deposition tool;
- means for measuring the thickness of the process layer for a sample of the wafers;
- means for generating predicted process layer thicknesses for the wafers not measured based on the process layer thickness measurements and the thickness profile model; and
- means for etching the process layer in an etching tool in accordance with an operating recipe, the operating recipe being based on the predicted process layer thicknesses.

* * * * *